United States Patent [19]
DesJardin et al.

[11] Patent Number: 5,349,234
[45] Date of Patent: Sep. 20, 1994

[54] PACKAGE AND METHOD FOR ASSEMBLY OF INFRA-RED IMAGING DEVICES

[75] Inventors: William F. DesJardin, Rochester; Edward J. Ozimek, Penfield; Luis A. Rivera, Rochester; Terry Tarn, Pittsford, all of N.Y.

[73] Assignee: Eastman Kodak Company, Rochester, N.Y.

[21] Appl. No.: 890,451

[22] Filed: May 29, 1992

[51] Int. Cl.$^5$ .............. H01L 23/02; H01L 21/44
[52] U.S. Cl. .................. 257/684; 257/692; 257/693; 257/698; 257/700; 257/701; 257/704; 257/707; 257/434; 437/203; 437/209; 437/214; 437/215
[58] Field of Search .......... 257/700, 684, 692, 698, 257/707, 434; 437/203, 209, 214, 215

[56] References Cited

U.S. PATENT DOCUMENTS

| | | | |
|---|---|---|---|
| 4,762,983 | 8/1988 | Oogita et al. | 235/1 |
| 4,824,511 | 4/1989 | Hartman et al. | 156/306.6 |
| 4,953,001 | 8/1990 | Kaiser | 257/700 |
| 5,025,306 | 6/1991 | Johnson | 257/700 |
| 5,103,290 | 4/1992 | Temple et al. | 257/698 |

FOREIGN PATENT DOCUMENTS

| | | |
|---|---|---|
| 0171801 | 2/1986 | European Pat. Off. |
| 0421133 | 4/1991 | European Pat. Off. |
| 3104623 | 8/1982 | Fed. Rep. of Germany |
| 59-76465 | 5/1984 | Japan |
| 62007531 | 6/1985 | Japan |
| 0057661 | 3/1989 | Japan .............. 257/698 |
| 1-57661 | 3/1989 | Japan |
| 2-246271 | 10/1990 | Japan |
| 2-249269 | 10/1990 | Japan |
| 2-299265 | 12/1990 | Japan |
| 2-306660 | 12/1990 | Japan |
| 2231199 | 11/1990 | United Kingdom |

*Primary Examiner*—Edward Wojciechowiz
*Attorney, Agent, or Firm*—Raymond L. Owens

[57] ABSTRACT

Apparatus and a method for the packaging of semiconductor chips to simplify assembly while improving thermal dissipation from the chip and reducing stress in the chip due to differential thermal expansion between the chip and its package as they are cycled over a temperature range are disclosed. An adhesive tape covers an active area of the chip and leaving bonding pads on the chip exposed through a recess in the adhesive tape. A body with a similar recess supports the other side of the tape. Wire bonds are made in the recess to connect bonding pads on the body to the chip. A lid covers the recess to protect the wire bonds.

29 Claims, 2 Drawing Sheets

PACKAGE AND METHOD FOR ASSEMBLY OF INFRA-RED IMAGING DEVICES

FIELD OF INVENTION

This invention relates to a method and apparatus for the packaging of semiconductor chips, and more particularly, to the packaging of infra-red detectors which present special requirements beyond those typically found in computer or communications applications.

BACKGROUND OF THE INVENTION

Silicon semiconductor devices are employed in the detection of infra-red energy because the energy can penetrate into the silicon. In a typical detector, a back side of a silicon chip is directed toward a source of light energy which penetrates into the chip and is sensed on an opposite side of the chip which contains detection circuitry. The need to expose the backside of the chip presents special packaging problems which are not present in computer or communications chips where the back side is attached to the package.

Infra-red imaging devices are in some applications fabricated on silicon chips which are greater than one centimeter on a side. The chip and the package in which its is held must also operate at cryogenic temperatures. Differences in thermal expansion between the chip and the package as they descend from the temperature of bonding to minus 196 degrees Centigrade can cause stress in the chip which is a brittle material.

Various package designs for infra-red imaging devices are known. A first design employs a package shaped like a picture frame. A back side of a chip faces out from behind the picture frame and edges of the backside of the chip are bonded to an interior periphery of the picture frame. A front side of the chip is open to interior portions of the picture frame where wire bonds are made between the chip and the picture frame. Heat must be dissipated via a long path from the front side of the chip through the semiconductor material of the chip to the edges thereof which are bonded to the picture frame. Another problem with this design is that the area for back side illumination of the chip is reduced by the area needed for the bond to the picture frame. Another problem is alignment of the chip in the opening of the package.

A second design is used with "flip-chip" type of bonding where a chip having solder balls which are built upon the active circuit bearing side of the chip are bonding to a package. The solder balls are aligned indirectly to bonding pads on the package since the joint is hidden from view. Heat is applied to make the solder bond and a space typically remains between the chip and the package. Heat must be dissipated from the active elements along the chip and down through the solder bonds. One disadvantage of this structure is that the metal (solder) bonds which serve both to communicate signals and to mount the chip are subject to fatigue from thermal stress caused by differential thermal expansion between the package and the chip as both experience temperature changes. In addition, the costs associated with this type of design are higher than is desirable in some applications.

It is desirable to package an infra-red detecting semiconductor chip to accommodate the difference in thermal expansion between a chip and its package so as to reduce the mechanical stress applied to the chip during changes in temperature. It is also desirable to provide an efficient path for thermal conduction from active elements on the chip to the package which acts as a heat sink. It is useful to provide for ease of assembly by being able to observe locating indicia on the chip, and to assemble the chip to the package in a reproducible process with a minimum number of steps.

SUMMARY OF THE INVENTION

The present invention is directed toward a method and package for use with semiconductor chips including infra-red (energy, light) detectors which present special requirements beyond those found in computer or communications applications.

Viewed from one aspect, the present invention is directed to a package for an energy detector. The package comprises a body, electrical leads on the body, and external contacts on the body. The body has front and back sides, and a periphery which defines at least one recess. The recess is so located along the periphery of the body such that upon assembly of the energy detector and the package, the recess defined by the body aligns with bonding pads on the energy detector. The electrical leads are supported on the body. The external contacts (electrical connectors) are on the upper side of the body and are electrically connected to the bonding pads.

Viewed from another aspect, the present invention is directed to a package for a semiconductor chip. The package comprises a body, and external contacts. The body has front and back sides and is formed of a multilayer material. A periphery of the body defines at least one recess which is in the form of a stepped recess, a first step of which supports electrical leads, and a second step of which contains a shelf. The recess is so located along the periphery of the body such that upon assembly of the package, the recess defined by the body aligns with bonding pads on the semiconductor chip. The external contacts on the front side of the body are electrically connected to the bonding pads on the body.

Viewed from still another aspect, the present invention is directed to a package for an energy detector having first bonding areas on a first side thereof and having a second side thereof which is adapted to have energy incident thereon. The package comprises a body and a set of electrical leads on the body. The body has front and back sides, the front side having an area which is smaller than the first side of the energy detector such that when the first side of the energy detector is coupled to the front side of the body, the bonding areas of the energy detector are not covered by the body. The electrical leads are supported on the body at locations on the body other than those that will be covered by the energy detector when same is coupled to the body. The external contacts on the second side of the body are electrically connected to the second bonding areas.

Viewed from still another aspect, the present invention is directed to a package for an energy detector having bonding areas on a first side thereof and having a second side thereof which is adapted to have energy incident thereon. The package comprises a body having electrical leads and external contacts. The body has front and back sides, the front side having a configuration such that when the first side of the energy detector is coupled to the front side of the body, the bonding areas of the energy detector are not covered by the body. The electrical lead areas are supported on the body at locations on the body other than those that will be covered by the energy detector when same is coupled to the body. The external contacts on the second side of the body are electrically connected to the second bonding areas.

Viewed from still another aspect, the present invention is directed to a combination. The combination comprises a semiconductor chip, an adhesive tape, a body and external contacts. The semiconductor chip has a back side adapted to have light incident thereon and has a front side which supports bonding pads thereon. The adhesive tape is in contact with the front side of the semiconductor chip, but not covering or in contact with portions of the semiconductor chip which have the bonding pads thereon. The body is formed of a multilayer alumina ceramic and has front and back sides, the back side is in contact with the adhesive tape, a periphery of the body defines at least one recess therethrough which allows the bonding pads on the semiconductor chip to be exposed below the recess. The external contacts on the front side of the body are connected to electrical leads on the body.

Viewed from still another aspect, the present invention is directed to a method of packaging a semiconductor chip. The method comprises the a first step of aligning a recess in a body with an adhesive tape. A second step of causing the body and the tape to come into contact so as to attach the body to the tape. A third step of aligning the recess in the body to indicia on a chip. A fourth step of causing the tape and the semiconductor chip to come into contact sop as to attach the tape to the semiconductor chip. A fifth step of curing the adhesive tape such that a mechanical and thermal bond is created between the semiconductor chip and the body; and a sixth step of bonding electrical conductors between the bonding pads on the chip and electrical leads on the body.

The embodiments described above provide an enclosure for a semiconductor chip which reduces thermal stress while nevertheless providing for the efficient removal of heat which is generated on the active side on the chip. Face-up bonding of the chip also provides ease of alignment between the chip and package. The use of a die cut adhesive tape controls the thickness and placement of the adhesive, which improves the overall quality of the product thereby improving yields in assembly and profits.

These and other advantages of the invention will be better understood from consideration of the following detailed description taken in conjunction with the accompanying drawings.

The drawings are not necessarily to scale.

DETAILED DESCRIPTION

Figure 1:
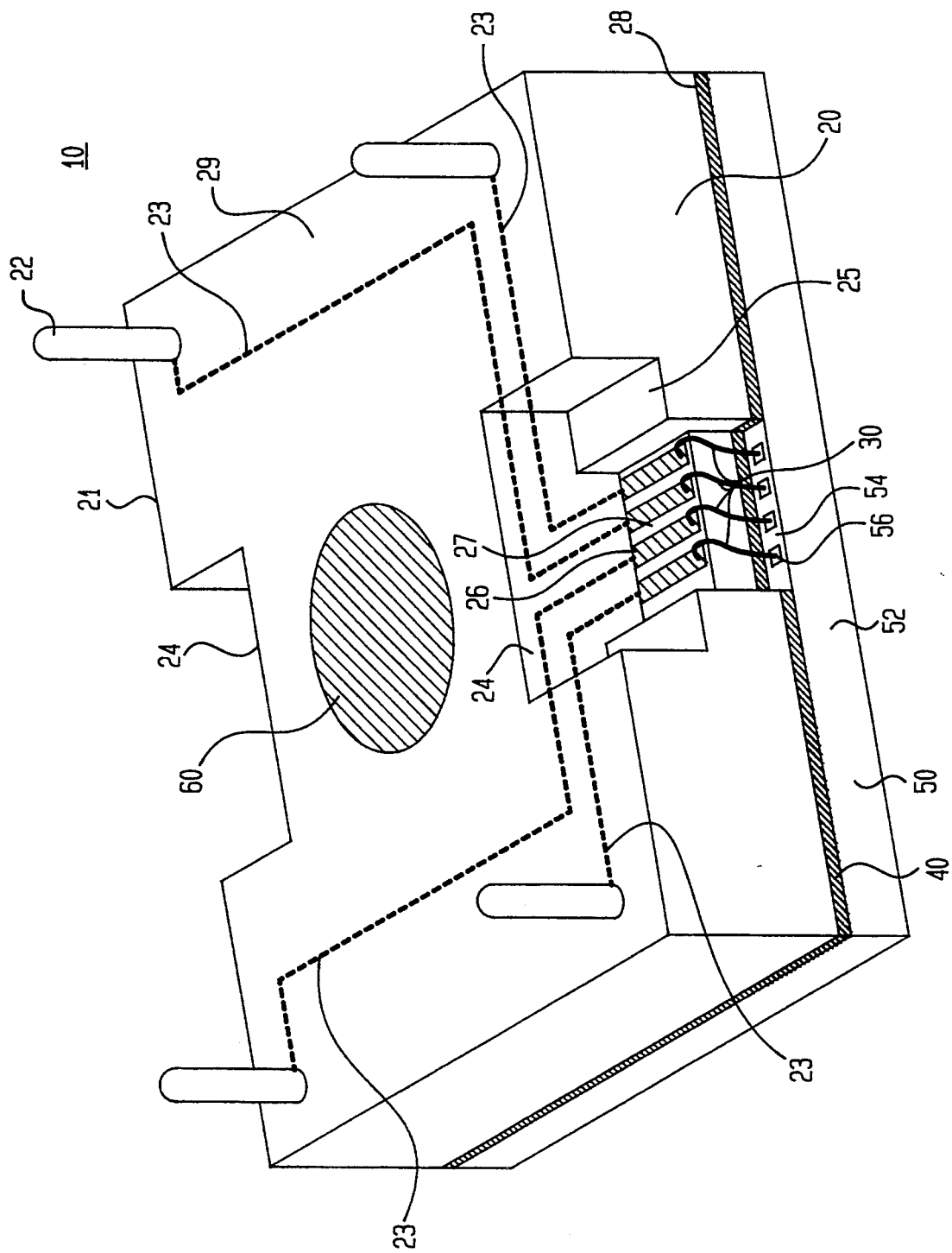
FIG. 1 shows a perspective view of a package and semiconductor chip in accordance with the present invention.

Referring now to FIG. 1, there is shown semiconductor chip (energy detector) 50 in combination with a package 10 in accordance with the present invention. Package 10 comprises a body 20 into which external contacts (pins) 22 are brazed to an upper surface 29. A periphery of body 20 defines two recesses 24. Each recess 24 is layered. A first layer contains a first shelf or step 25, and a second shelf or step 27 supports electrical leads 26 and interconnections (conductors) 23 (shown by dashed lines) which electrically connect electrical leads 26 to pins 22. A vertical space between electrical leads 26 and shelf 25 is provided to accommodate wire bonds 30. The chip 50 has one side (i.e., a back side) 52 which is adapted to have energy (e.g., infra-red energy) incident thereon, and has a front (i.e., circuit) side 54 which contains circuitry (not shown in FIG. 1 but shown symbolically as conductors 58 in FIG. 2) and which is bonded to a backside 28 of body 20 by an adhesive tape 40. The circuit side 54 of chip 50 contains thereon bonding pads 56 which are interconnected to interior active portions (not shown) of chip 50. Bonding pads 56 are arranged near the outer edge of circuit side 54. The wire bonds 30 interconnect bonding pads 26 on body 20 to bonding pads 56 on chip 50. The chip 50 has a second set of bonding pads 50 (not shown) on the opposite side thereof from the set shown. The rear recess 24, which is only partially shown in FIG. 1, is essentially identical to the front recess 24 and contains bonding pads 56 (not shown) and wire bonds 30 (not shown) which are connect theses bonding pads 56 to pins 22 (not shown). While for illustrative purposes package 10 shows only four pins 22, it typically comprises a plurality of pins 22, e.g., fourteen, and a corresponding number of bonding pads 56. Metallized layer 60, which is optional, is on the upper side 29 of body 20 so as to provide a solder contact to body 20.

Figure 2:
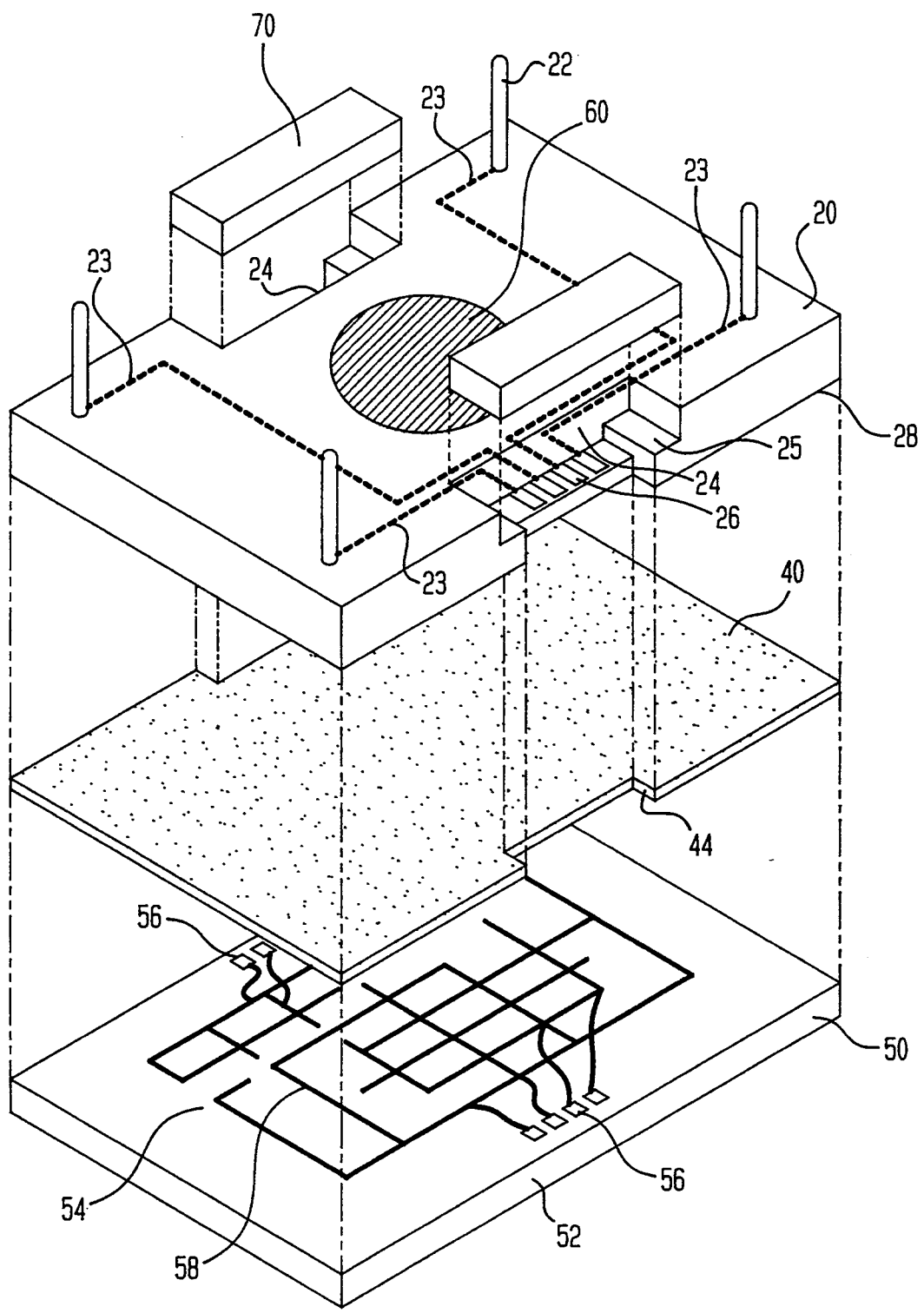
FIG. 2 shows an exploded view of the package and chip of FIG. 1 and further includes a lid for the package.

Referring now to FIG. 2, there is shown an exploded view of package 10 and chip 50, which are shown in FIG. 1, but with the addition of lids 70 which are supported by the shelf 25 and without the bonding wires 30 shown in FIG. 1. FIG. 2 shows the periphery of the adhesive tape 40 which defines two recesses 44.. The two recesses 44 are approximately the same size as recesses 24 on the back side 28 of body 20. After assembly of chip 50 to package 10 via tape 40, bonding pads 56 remain exposed so as to permit the wire bonds 30 to be made between the electrical leads 56 on the chip 50 and the electrical leads 26 on the body 20. In a preferred embodiment tape 40 is made of epoxy which is reinforced with fiberglass. The thickness of the tape ranges from 1 to 15 mils. In practice, thicker tape is used with larger chips in order to reduce the differential thermal expansion stress applied to the chip. Adhesive tape made from polyimides have also been used. The exposed from side 54 of the chip 50 symbolically shows conductors 58 which symbolize metallization of circuitry thereof which is connected to the bonding pads 56 of the body 20.

The package 10 described in FIG. 1 and FIG. 2 possesses advantages over the prior art in both performance and assembly. The present invention is directed at the packaging of large semiconductor chips, e.g., greater than 1 centimeter on each side, in an application in which heat must be removed from the active surface of the semiconductor chip. This application is directed toward the detection of infra-red energy. Accordingly, infra-red light is directed to the back side of the chip. Infra-red light (energy) penetrates into materials like silicon. The ability to use the back side of the chip as a heat sink is thus lost.

The present invention is directed to cryogenic environments, e.g., liquid nitrogen maintained at 77 degrees Kelvin. In this case the full active area of chip 50 is in thermal contact with a thin adhesive layer 40 which in turn is bonded to body 20. Heat generated by chip 50 during operation thereof passes directly into the adhesive tape 40 and then into the body 20. It does not have to passes serially along the entire length and width of the chip to the outer edges thereof as is the case with some prior art packages described herein before in the Background of the Invention. Thus the thermal path from chip 50 to body 20 is shorter and much wider in cross section than the previously discussed prior art packages. This results in improved efficiency of heat dissipation.

The bond between chip 50 and the body 20 is not as rigid as with a solder bond. The adhesive tape is compliant enough to reduce the stress caused by differential thermal expansion between chip 50 and body 20 as the assembly is cycled between ordinary and cryogenic temperatures.

Other advantages of the present invention accrue during assembly. The adhesive tape is typically die cut to match the back side of the body, which includes one or more recesses. Control of the thickness of the tape layer is achieved before the bonding operation by the specifications which control of the tape. The tape is typically already partially cured before use and therefore there is no smearing of adhesive to obscure the bonding pads on the chip. This control of the bond area and thickness improves the overall quality of the package and increases the yield of the assembly operation.

Another advantage of the present invention is the ability to see the bonding pads and indicia for alignment on the chip 50 and the body 20 during the assembly process.

In the assembly process body 20 is heated to approximately 100 degrees Centigrade with back side 28 facing upward in an alignment fixture. Adhesive tape 40, which is in a partially cured state and which has been precut to define at least one recess 44, is dropped onto back side 28. The adhesive tape 40 adheres to the back side 28 of the body 20 which is then moved to another fixture where the body-tape combination is aligned to chip 50 with the aid of indicia on the front side 54 of the chip. The front side 54 is brought into contact with the adhesive tape 40 and the resulting structure is clamped in place, and then cured at 150 degrees Centigrade for 30 minutes to form a permanently bonded structure. Wire bonds 30 are then bonded from bonding pads 26 of package 10 to bonding pads 56 of chip 50. A lid 70 is then placed in recess 24 to seal package 10.

It is understood that the embodiments described herein are merely illustrative of the general principles of the invention. Various modifications are possible consistent with the spirit of the invention. For example, body 20 could be made from a wide variety of ceramic or organic materials, and similarly adhesive tape 40 could be made from a variety of organic materials to match the bonding and expansion characteristics of body 20. Still further, the advantages in assembly and in the packaging assembly could be utilized in applications other than infra-red detection. Still further, the geometry, placement, and number of recesses in the body and adhesive tape can be varied to accommodate the bonding pad geometry of other chips. Furthermore, a chip can be attached to package like package 10 by means other than an adhesive tape 40. For example, a thermally conductive insulating adhesive could be used. Still further, bonding pads 56 could be located on back side 29 of package 10 with shelf 25 and lids 70 being eliminated. Still further, package 10 could have a greater number of recess and corresponding bonding pads 56. For example, if chip 50 has four sets of bonding pads 26 with one on each of four sides, then package 50 corresponding will have one recess 24 on each of its four sides.

What is claimed is:

1. A packaged energy sensor comprising:
a device for sensing incident energy, said device having a first surface for exposure to said energy and a second surface comprising a plurality of bond pads disposed at a peripheral portion of the second surface;
a body having an upper surface, a lower surface for holding the device, and a recess portion in general alignment with said bond pads;
electrical leads supported by said body in said recess body portion at a location proximate said bond pads;
said body having external electrical connectors extending from the body and electrically connected to the electrical leads supported by said body; and
wire connecting the bond pads on the chip to the electrical leads in the recess of the body.

2. The sensor of claim 1 further comprising an adhesive layer disposed between the second surface of the device and the lower surface of the body for holding the device on the lower surface of the body.

3. The package of claim 1 wherein the body is made from an alumina ceramic.

4. The package of claim 2 wherein the adhesive tape is an epoxy tape.

5. The package of claim 2 wherein the adhesive tape is a polyimide tape.

6. The package of claim 2 wherein the adhesive tape is reinforced with fibers.

7. The package of claim 2 wherein the adhesive tape defines at least one recess which aligns with at least one recess defined by the body.

8. The package of claim 1 wherein the energy detector is a semiconductor chip.

9. The sensor of claim 2 wherein the adhesive layer comprises adhesive tape configured to substantially cover both the second surface of the device and the lower surface of the body and to expose the bond pads of the device and the recess of the body.

10. The sensor of claim 9 wherein the adhesive tape mechanically and thermally bonds the device to the body.

11. The sensor of claim 1 further comprising a lid configured to fit inside the recess portion of the body.

12. The sensor of claim 1 wherein said body further comprises a shelf disposed in said recess portion and above said bond pads for supporting the electrical leads.

13. The sensor of claim 1 further comprising a metallized layer disposed on the upper surface of the body for providing a solder contact.

14. A package for a semiconductor chip comprising:
a body having an upper surface, a lower surface for holding a device, and a stepped, recessed peripheral portion including
first and second shelves disposed between the upper and lower surfaces;
electrical leads supported on one of said shelves;
external electrical connectors supported by said body and electrically connected to said electrical leads;
a semiconductor device held by said body and having bond pads disposed on a first surface thereof, generally aligned with the recessed peripheral portion of said body and electrically connected to said electrical leads; and wire connecting the bond pads on the chip to the electrical leads in the recess of the body.

15. The package of claim 14 further comprising:
an adhesive tape holding the semiconductor chip to the lower surface of the body, said tape substantially covering the lower surface of the body and the first surface of the chip, the tape being configured to expose the bond pads and the recessed portion of the body and adapted to mechanically and thermally bond the chip to the body;
and a lid supported by said shelves and endorsing the recessed peripheral portion of the body.

16. The package of claim 14 wherein the body is made from an alumina ceramic.

17. The package of claim 15 wherein the adhesive tape is an epoxy tape.

18. The package of claim 15 wherein the adhesive tape is a polyimide tape.

19. The package of claim 15 wherein the adhesive tape is reinforced with fibers.

20. The package of claim 15 wherein the adhesive tape defines at least one recess which aligns with at least one recess defined by the body.

21. In combination:
a semiconductor chip with a first surface adapted to have light incident thereon and a second surface for supporting bond pads thereon;
an adhesive tape contacting the second surface of the chip on substantially the entire surface except for the bond pads thereof;
a body of alumina ceramic having upper and lower surfaces, the lower surface contacting the adhesive tape, the body having a peripheral portion with a recess therein and having electrical leads supported in said recess at a location proximate the bond pads of the chip;
external electrical connectors disposed on the upper surface of the body and electrically coupled through the body to the electrical leads at the recess portion thereof and to the bond pads; and wire connecting the bond pads on the chip to the electrical leads in the recess of the body.

22. The combination of claim 21 further comprising:
a lid enclosing the recess portion.

23. The combination of claim 21 wherein the adhesive tape is a compliant reinforced epoxy tape.

24. The combination of claim 21 wherein the adhesive tape is a compliant reinforced polyimide tape.

25. The combination of claim 21 wherein the external contacts are electrically conductive pins which are brazed into the body at right angles to the front surface and which are electrically connected to bond pads on the body.

26. The combination of claim 21 wherein the pins are made form a material which approximates the thermal expansion characteristics of the body.

27. The combination of claim 21 wherein the material is of a composition which is commercially sold under the name of Kovar.

28. A method of packaging a semiconductor chip comprising the steps of:
providing a body with a recess in the periphery thereof and having electrical leads supported in said recess;
aligning a recess in a body with an adhesive tape;
causing the body and the tape to come into contact so as to attach the body to the tape;
aligning the recess int eh body to indicia on a chip having bonding pads;
causing the tape and the semiconductor chip to come into contact so as to attach the tape to the semiconductor chip;
curing the adhesive tape such that a mechanical and thermal bond is created between the semiconductor chip and the body;
wire bonding the bonding pads on the chip and electrical leads in the recess of the body.

29. The method of claim 28 further comprising the step of placing a lid within a recess in the body so as to protect the wire bonds between the body and the chip.

* * * * *